(12) United States Patent
Lindemann

(10) Patent No.: US 11,109,155 B2
(45) Date of Patent: Aug. 31, 2021

(54) BASS ENHANCEMENT

(71) Applicant: Cirrus Logic International Semiconductor Ltd., Edinburgh (GB)

(72) Inventor: Eric Lindemann, Boulder, CO (US)

(73) Assignee: Cirrus Logic, Inc., Austin, TX (US)

( * ) Notice: Subject to any disclaimer, the term of this patent is extended or adjusted under 35 U.S.C. 154(b) by 232 days.

(21) Appl. No.: 15/435,574

(22) Filed: Feb. 17, 2017

(65) Prior Publication Data

US 2018/0242083 A1  Aug. 23, 2018

(51) Int. Cl.
| | |
|---|---|
| *H04R 3/04* | (2006.01) |
| *H03G 9/02* | (2006.01) |
| *G10L 21/0208* | (2013.01) |
| *G10L 25/21* | (2013.01) |
| *H03G 3/30* | (2006.01) |
| *H03G 5/16* | (2006.01) |

(52) U.S. Cl.
CPC ............ *H04R 3/04* (2013.01); *G10L 21/0208* (2013.01); *G10L 25/21* (2013.01); *H03G 3/3005* (2013.01); *H03G 9/025* (2013.01); *H03G 5/165* (2013.01)

(58) Field of Classification Search
CPC combination set(s) only.
See application file for complete search history.

(56) References Cited

U.S. PATENT DOCUMENTS

| | | | |
|---|---|---|---|
| 4,495,640 A * | 1/1985 | Frey ........................ | G10H 1/12 |
| | | | 333/172 |
| 5,133,015 A * | 7/1992 | Scholz .................... | G10H 1/16 |
| | | | 381/61 |
| 5,930,373 A | 7/1999 | Shashoua et al. | |
| 6,252,495 B1 * | 6/2001 | Nakamura .......... | H04M 1/2747 |
| | | | 340/328 |
| 6,285,767 B1 | 9/2001 | Klayman | |
| 6,504,935 B1 * | 1/2003 | Jackson ................ | G10H 1/125 |
| | | | 381/61 |

(Continued)

FOREIGN PATENT DOCUMENTS

| | | |
|---|---|---|
| CN | 1477904 A | 2/2004 |
| CN | 101373961 A | 2/2009 |

(Continued)

OTHER PUBLICATIONS

Oo et al., "Perceptually-Motivated Objective Grading of Nonlinear Processing in Virtual-Bass Systems", J. Audio Eng. Soc., Nov. 1, 2011, vol. 59, No. 11, pp. 804-824.

(Continued)

*Primary Examiner* — Duc Nguyen
*Assistant Examiner* — Assad Mohammed
(74) *Attorney, Agent, or Firm* — Norton Rose Fulbright US LLP

(57) ABSTRACT

A bass enhancement may be applied to improve the perception of low-frequency sounds by a user of an electronic device. A distortion function may be applied to the audio signal that results in creation of higher frequency content related to the low-frequency sounds. This higher frequency content may be interpreted by a listener's ear in a similar manner as the low-frequency sounds. The distortion function may be a Sigmoid function. Bass enhancements may also include scaling of the audio signal prior to distortion, adaptation of the distortion, or gap band filtering prior to the distortion.

20 Claims, 11 Drawing Sheets

(56) References Cited

U.S. PATENT DOCUMENTS

| | | | |
|---|---|---|---|
| 9,607,628 B2* | 3/2017 | Gautama | H03F 3/187 |
| 2002/0051546 A1* | 5/2002 | Bizjak | H03G 7/06 |
| | | | 381/106 |
| 2005/0265561 A1 | 12/2005 | Manish et al. | |
| 2007/0274538 A1 | 11/2007 | Van Reck | |
| 2008/0243496 A1* | 10/2008 | Wang | G10L 21/0208 |
| | | | 704/226 |
| 2010/0092004 A1* | 4/2010 | Kuze | H04R 3/08 |
| | | | 381/71.11 |
| 2010/0215192 A1* | 8/2010 | Minnaar | H04R 3/04 |
| | | | 381/98 |
| 2010/0228368 A1 | 9/2010 | Oh et al. | |
| 2011/0110530 A1* | 5/2011 | Kimura | G11B 27/10 |
| | | | 381/86 |
| 2013/0263721 A1* | 10/2013 | Shavit | G10H 3/186 |
| | | | 84/626 |
| 2016/0111110 A1* | 4/2016 | Gautama | H03F 3/187 |
| | | | 381/94.3 |
| 2017/0089954 A1* | 3/2017 | Pickerd | G01R 13/0272 |
| 2017/0127196 A1* | 5/2017 | Blum | H02J 50/12 |

FOREIGN PATENT DOCUMENTS

| | | |
|---|---|---|
| CN | 101964190 A | 2/2011 |
| CN | 102855882 A | 1/2013 |
| CN | 104012112 A | 8/2014 |
| CN | 104471961 A | 3/2015 |
| CN | 104936088 A | 9/2015 |
| EP | 0972426 A1 | 1/2000 |
| EP | 1947903 A1 | 7/2008 |
| WO | 199846044 A1 | 10/1998 |
| WO | 2013/181299 A1 | 12/2013 |

OTHER PUBLICATIONS

Oo et al., "Harmonic Analysis of Nonlinear Devices for Virtual Bass System", IEEE, Jul. 2008, pp. 279-284.

Yeh, David Te-Mao "Digital Implementation of Musical Distortion Circuits by Analysis and Simulation" Dissertation submitted Jun. 2009 to Standford University.

Lim et al., "Synthesis of Polynomial-Based Nonlinear Device and Harmonic Shifting Technique for Virtual Bass System", IEEE, 2009, pp. 1871-1874.

Lee et al., "Effective Bass Enhancement Using Second-Order Adaptive Notch Filter", IEEE Transactions on Consumer Electronics, vol. 54, No. 2, May 2008, pp. 663-668.

Hill et al., "A hybrid virtual bass system for optimized steadystate and transient performance", IEEE, 2010.

Gan et al., "Virtual Bass for Home Entertainment, Multimedia PC, Game Station and Portable Audio Systems", IEEE Transactions on Consumer Electronics, vol. 47, No. 4, Nov. 2001, pp. 787-784.

Aarts et al., "Improving Perceived Bass and Reconstruction of High Frequencies for Band Limited Signals", IEEE Benelux Workshop on Model based Processing and Coding of Audio (MPCA-2002), Leuven, Belgium, Nov. 15, 2002, pp. 59-71.

Ben-Tzur et al., "The Effect of the MaxxBass Psychoacoustic Bass Enhancement System on Loudspeaker Design" AES Convention 106, May 1, 1999.

\* cited by examiner

BASS ENHANCEMENT

FIELD OF THE DISCLOSURE

The instant disclosure relates to audio processing. More specifically, portions of this disclosure relate to audio processing for improving perception of low-frequency sounds by listeners.

BACKGROUND

Low-frequency sounds challenge any audio system's output capabilities. Low-frequency sounds have long wavelengths that are particularly difficult to replicate using small speakers. Professional audio systems for concert music, and even home movie stereo systems, include at least one large speaker particularly useful for generating low-frequency sounds. For example, home movie stereo systems have large subwoofers for generating low-frequency sounds, such as explosions and rumblings to accompany scenes in a movie. However, using large speakers, such as subwoofers, is not always an option for generating low-frequency sounds.

Portable devices are becoming more ubiquitous in everyday life. They influence how we communicate with each other, interact with our music, and organize our lives. For example, many consumers enjoy their music on portable audio players, such as MP3 players or cellular phones. Portable devices become easier and more enjoyable to use when they shrink in size while still offering the same or better capabilities. The desire for smaller electronic devices creates a tension between requirements of small size and maintaining loud and bass-rich sound. Whether the sounds are generated from an internal microspeaker or connected external speakers, mobile devices generally do not have space for a transducer that is several inches or even a foot in one dimension. Dimensions of loudspeakers in portable devices are often limited by the form factor and layout of the device itself.

Microspeakers have diaphragms that are, instead, only millimeters or centimeters in size in their largest diameter. These smaller transducers exhibit a rapid decline in output pressure level as a function of input voltage at low frequencies below the resonant frequency of the speaker, such as below 1000 Hertz. Because increasing the size of the transducers is not a feasible option for small consumer electronics, other techniques for handling low-frequency sounds are required.

Conventional audio processing may be used for improving output quality of low-frequency sounds. For example, frequencies in an audio signal below the speaker resonance, such as below 1000 Hertz, may be boosted using conventional equalization (EQ) to compensate for a large roll-off of a speaker system frequency response below the speaker resonance. After applying the EQ response, the signal may be passed through an excursion limiter that constrains the signal to stay within an excursion limit of the speaker. A bass or kick drum part, having a fundamental frequency in the 50-150 Hertz range, may be completely inaudible on a microspeaker whose lowest audible frequency may be around 200 Hz. These sounds can have some harmonic energy above 200 Hertz. However, this energy may be weak. Thus, the original bass part may be very soft or even inaudible. A user of the device is thus not listening to an accurate representation of the music as intended by the artist.

Shortcomings mentioned here are only representative and are included simply to highlight that a need exists for improved electrical components, particularly for audio systems employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

A bass enhancement may be applied to improve the perception of low-frequency sounds by a user of an electronic device. The bass enhancement may operate on a portion or all of an audio signal to modify the energy content of the low-frequency sound, and thus compensate for a poor response of a speaker. For example, a non-linear distortion applied to low frequencies of an audio signal will generate harmonic distortion of the low-frequency audio content such that distortion components reach higher frequencies. These higher harmonic frequency components are easier to reproduce with small speakers, such as a microspeaker of a mobile device. A 100 Hz pure tone fundamental frequency when passed through a suitable non-linear distortion function will produce a series of harmonics that are integer multiples of the fundamental (i.e. 200 Hz, 300 Hz, 400 Hz, 500 Hz, etc.). When the human auditory system is presented with a cluster of higher harmonics (e.g. 300 Hz, 400 Hz, 500 Hz), it infers the fundamental frequency 100 Hz even when the first few harmonics and fundamental (e.g. 100 Hz, 200 Hz) are completely inaudible. Thus, a listener can better perceive the pitch of the low-frequency sounds in an audio signal, such as a bass guitar or kick drum even in the absence of true low frequencies. The non-linear distortion may be applied to a low-pass filtered version of the audio signal, such that only low-frequency content is passed through the distortion function. After the low frequency audio content is distorted, the distorted signal may be filtered through a high-pass filter to further shape the higher frequency distortion components. Then, the distorted signals can be combined with the original signal or with a high-pass filtered version of original audio signal to form an output signal with boosted low frequency harmonics. Some examples of a non-linear function for applying distortion to an audio signal are a Sigmoid function or modified Sigmoid function.

Bass enhancement may include dynamically adjusting the distortion applied to a portion of the audio signal. A distortion, such as a non-linear distortion, applied to audio signals may be controlled by one or more parameters. For example, a relative intensity of distortion components generated by the distortion can be controlled through one or more parameters that control the numerical function used to generate the distortion. When the distortion is based on a Sigmoid function, one or more parameters can be controlled to adjust the shape of the Sigmoid function. One such parameter is a sharpness parameter. If the audio signal has a number of harmonics below a cut-off frequency, such as 120 Hertz, then a relatively soft Sigmoid distortion function may be used to generate new components above another cut-off frequency, such as 200 Hertz. However, if the audio signal has very low frequency content, e.g. 60 Hertz, and is relatively sinusoidal, without higher harmonics, then a sharper Sigmoid function may be used to generate distortion components. A control block may determine the one or more parameters for controlling the Sigmoid function by dividing the power of the over-200 Hertz distortion components by the power of the below-120 Hertz components of the original audio content. The one or more adaptive distortion control parameters may be adjusted to maintain an approximate predetermined power ratio, such as −6 dB, between the higher frequency components and the original low frequency components.

Distortion functions, such as the Sigmoid distortion function, are sensitive to the input level of the signal. If the input level is too low, then little or no distortion may result. To solve this, bass enhancement may include the application of infinite companding to a portion of the audio signal. Infinite companding includes applying gain to the input audio signal prior to application of distortion to boost the input audio signal to a full-scale signal. An inverse gain is then applied after the distortion is generated to return the distorted audio signal to the level of the original pre-distortion input audio signal.

Bass enhancement may include the application of a gap band filter to the audio signal when obtaining a first audio signal and a second audio signal to be processed separately and recombined for output to a speaker. The gap band filter may include a low-pass filter and a high-pass filter. The high-pass filter may eliminate low frequencies from the audio signal to generate a first audio signal. The low-pass filter may isolate the low frequencies from the audio signal to generate a second audio signal. Separating the low frequencies allows separate processing of the low-frequency content in the audio signal, such that the other content is not altered during bass enhancement. In some embodiments, the low-pass filter may have a different cut-off frequency than the high-pass filter, such that a frequency gap exists between the generated first and second audio signals. For example, the low-pass filter may have a cut-off frequency of 120 Hertz and the high-pass filter may have a cut-off frequency of 200 Hertz. Thus, the original audio content in the 120-200 Hertz frequencies is absent from a final signal, even after recombination of the first audio signal and a processed version of the second audio signal. The high frequency cut-off of the gap band, 200 Hertz in this example, is still below the lowest possible audible frequency of the microspeaker. Many sounds, including those generated by musical instruments such as bass, voice, keyboard, and guitars, have conflicting components in the frequency gap. However, energy at frequencies below 120 Hertz may be primarily, for example, pure bass sounds. Distorting a complex combination of sounds generated by different instruments in the gap band can create a highly-distorted mixing of components resulting in a low-quality audio signal. Thus, eliminating the original audio content in the gap frequencies can further improve perception of the enhanced low-frequency sounds. Additionally, the original content in the gap frequencies may have higher harmonic energy above the gap frequencies, such that eliminating the original content in the gap frequencies does not significantly affect the perception of the sounds with energy in the gap frequencies. The cut-off frequency for the high-pass filter and/or the low-pass filter of the gap band filter may be adjusted. For example, the cut-off frequency for one of the filters may be dynamically adjusted to track the pitch of the bass notes.

Each of the bass enhancements described herein may be operated individually or in combination with any other bass enhancements described herein or with other known bass enhancements. For example, non-linear dynamically adjustable distortion may be applied to an audio signal for bass enhancement. As another example, linear distortion may be applied to a gap band filtered audio signal for bass enhancement. As a further example, non-linear dynamically adjustable distortion may be applied to an audio signal, along with gap band filtering and infinite companding, for bass enhancement Electronic devices incorporating the bass enhancement described herein may benefit from improved audio reproduction by components of integrated circuits in the electronic devices. The integrated circuits may include a digital-to-analog converter (DAC). The DAC may be used to convert a digital signal, such as the content in a music file, to an analog representation of the digital signal. The analog signal output by the DAC may be an audio signal for processing by audio circuitry. That audio circuitry may implement one or more of the bass enhancements described herein. The DAC and audio processing circuitry, which may be integrated in an integrated circuit such as an audio controller, may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

According to one embodiment, a method may include enhancing the bass part of an input audio signal to be played through a small loudspeaker. The method may include low-pass filtering said input audio signal at a low-pass cutoff frequency to produce a low-pass audio signal comprised substantially of the bass part of said input audio signal; applying a sigmoid non-linearity to said first low-passed audio signal to produce a distorted low-pass audio signal comprising higher harmonics of said low-pass audio signal; and adding said distorted low-pass audio signal to said input audio signal to reinforce the higher harmonics of said bass part of said input audio signal.

According to another embodiment, a method may include enhancing the bass part of an input audio signal to be played through a small loudspeaker. The method may include low-pass filtering said input audio signal at a low-pass cutoff frequency to produce a low-pass audio signal comprised substantially of the bass part of said input audio signal; applying a non-linear function to said first low-passed audio signal to produce a distorted low-pass audio signal comprising higher harmonics of said low-pass audio signal; measuring the time-varying power of said low-pass audio signal to produce a low-pass power estimate; band-pass filtering said distorted low-pass audio signal with a band-pass filter covering a frequency range corresponding to the low frequency range of said small loudspeaker to produce a band-pass distorted audio signal; measuring the time-varying power of said band-pass audio signal to produce a band-bass power estimate; adjusting said non-linear function in response to said low-pass power estimate and said band-pass power estimate, such that the ratio of said band-pass power estimate to said low-pass power estimate maintains a nearly constant value; and adding said distorted low-pass audio signal to said input audio signal to reinforce the higher harmonics of said bass part of said input audio signal.

According to a further embodiment, a method may include enhancing the bass part of an input audio signal to be played through a small loudspeaker. The method may include low-pass filtering said audio signal at a low-pass cutoff frequency to produce a low-pass audio signal comprised substantially of the bass part of said input audio signal; estimating the time-varying amplitude envelope of said low-pass audio signal to produce a first amplitude envelope; adjusting the gain of said low-pass audio signal in response to said first amplitude envelope to produce a compressed low-pass audio signal, wherein the amplitude of said compressed low-pass audio signal is substantially full-scale; applying a non-linear function to said compressed low-pass audio signal to produce a distorted compressed low-pass audio signal comprising higher harmonics of said low-pass audio signal; adjusting the gain of said distorted compressed low-pass audio signal in response to said first amplitude envelope to produce a distorted expanded low-pass audio signal with time-varying amplitude substantially similar to said first amplitude envelope; and adding said distorted expanded low-pass audio signal to said input audio signal to reinforce the higher harmonics of said bass part of said input audio signal.

According to another embodiment, a method may include enhancing the bass part of an input audio signal to be played through a small loudspeaker with a limited low frequency response characterized by a lowest audible output frequency. The method may include low-pass filtering said input audio signal at a low-pass cutoff frequency substantially lower than said lowest audible output frequency to produce a low-pass audio signal comprised substantially of the bass part of said input audio signal; applying a non-linear function to said first low-passed audio signal to produce a distorted low-pass audio signal comprising higher harmonics of said low-pass audio signal, wherein a selected number of said higher harmonics are at a higher frequency then said lowest audible output frequency; and adding said distorted low-pass audio signal to said input audio signal to reinforce the higher harmonics of said bass part of said input audio signal.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
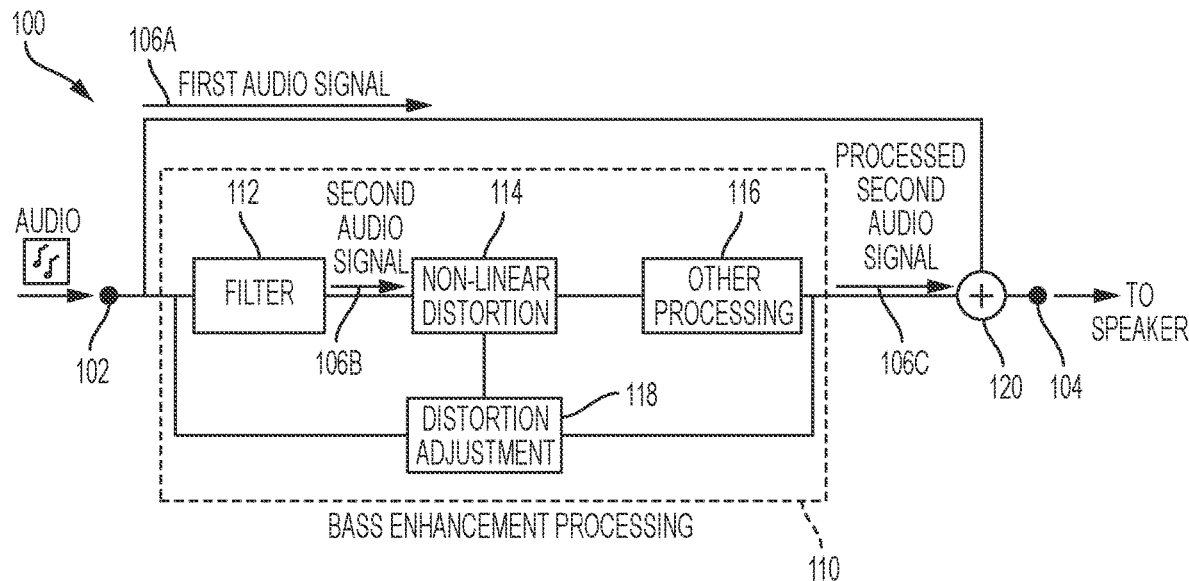
FIG. 1 is a block diagram illustrating bass enhancement processing with adjustable non-linear distortion according to some embodiments of the disclosure.

FIG. 1 is a block diagram illustrating bass enhancement processing with adjustable non-linear distortion according to some embodiments of the disclosure. An audio system 100 may include an input node 102 for receiving an original audio signal, such as an audio signal contained in a compressed MP3 music file or uncompressed WAV file. The original audio signal may be used to generate a first audio signal 106A and a second audio signal 106B. The second audio signal 106B may be produced from bass enhancement processing block 110. Bass enhancement processing block 110 may process the second audio signal 106B to improve perception of low-frequency sounds in the original audio signal by generating a processed second audio signal 106C. The first audio signal 106A may be processed separately from the bass enhancement block 110 or left unmodified. The first audio signal 106A and the processed second audio signal 106C may be mixed in combiner 120. An output of the combiner 120 is provided to output node 104, and that output node 104 may be coupled to downstream components such as equalization circuitry, other audio processing circuitry, an amplifier for driving a transducer, and/or a wireless radio for transmission of the audio to a remote device such as a Bluetooth headset.

The bass enhancement processing block 110 may include processing components for performing steps, such as calculating results of mathematical operations, that improve perception of low-frequency sounds in the audio signal received at input node 102. A filter 112 may generate the second audio signal 106B by eliminating high frequencies from the original audio signal. The filter 112 may be a low-pass filter with a cut-off frequency, such as 120 Hertz, selected to optimize bass enhancement processing. One technique for bass enhancement may include the application of distortion to the second audio signal 106B by non-linear distortion block 114. The non-linear distortion block 114 may apply a non-linear function, such as a Sigmoid function or a modified Sigmoid function, to the second audio signal 106B. A distorted second audio signal may be produced with components of the low-frequency sounds at higher frequencies, including at frequencies above the cut-off frequency of the filter 112. The distorted second audio signal may be further processed in other processing block 116 to produce the processed second audio signal 106C.

The non-linear distortion block 114 may be controlled to vary one or more parameters of the applied distortion by the distortion adjustment block 118. For example, the distortion adjustment block 118 may adjust a sharpness of an applied Sigmoid function. The distortion adjustment block 118 may adjust distortion block 114 based on the second audio signal 106B and the processed second audio signal 106C. For example, the non-linear distortion block 114 may determine the one or more parameters for controlling the Sigmoid function by dividing the power of the over-200 Hertz distortion components from the processed second audio signal 106C by the power of the below-120 Hertz components of the second audio content 106B. The one or more adaptive distortion control parameters may be adjusted to maintain an approximate power ratio at a predetermined ratio, such as −6 dB.

Figure 2:
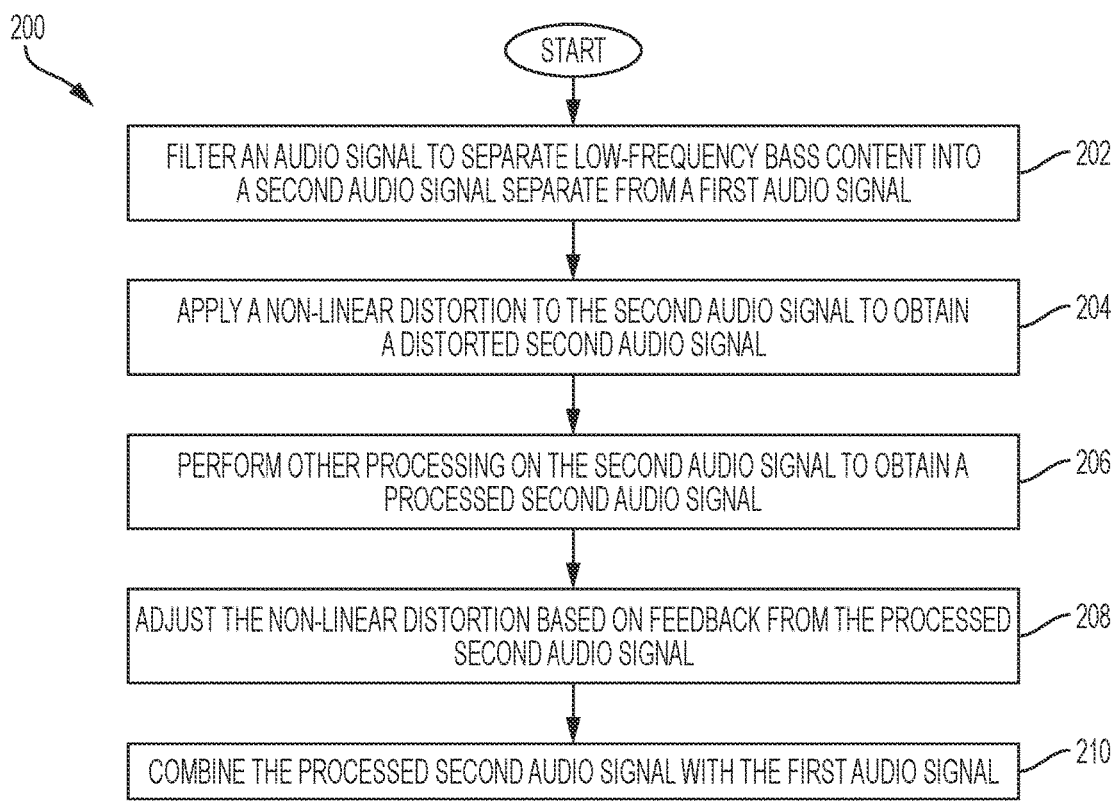
FIG. 2 is a flow chart illustrating an example method for bass enhancement using a non-linear distortion function according to some embodiments of the disclosure.

Operations for performing the bass enhancement processing in block 110 are described with reference to FIG. 2. FIG. 2 is a flow chart illustrating an example method for bass enhancement using a non-linear distortion function according to some embodiments of the disclosure. A method 200 may begin at block 202 with filtering an audio signal to separate low-frequency bass content into a second audio signal separate from a first audio signal that does not contain all of the low-frequency bass content. The method 200 may continue to block 204 with applying a non-linear distortion to the second audio signal to obtain a distorted second audio signal. Other processing may be performed at block 206 on the distorted second audio signal to produce a processed second audio signal. At block 208, the non-linear distortion at block 204 may be adjusted based on feedback from the processed second audio signal and/or the second audio signal. At block 210, the processed second audio signal is combined with the first audio signal. The method 200 may be repeated as audio signals are received by a processor, such as additional portions of a music file. The processor may use software executing on a processor, such as a digital signal processor (DSP), or physical circuitry on a printed circuit board (PCB), wherein the processor or physical circuity is configured to execute steps from FIG. 2.

Figure 3:
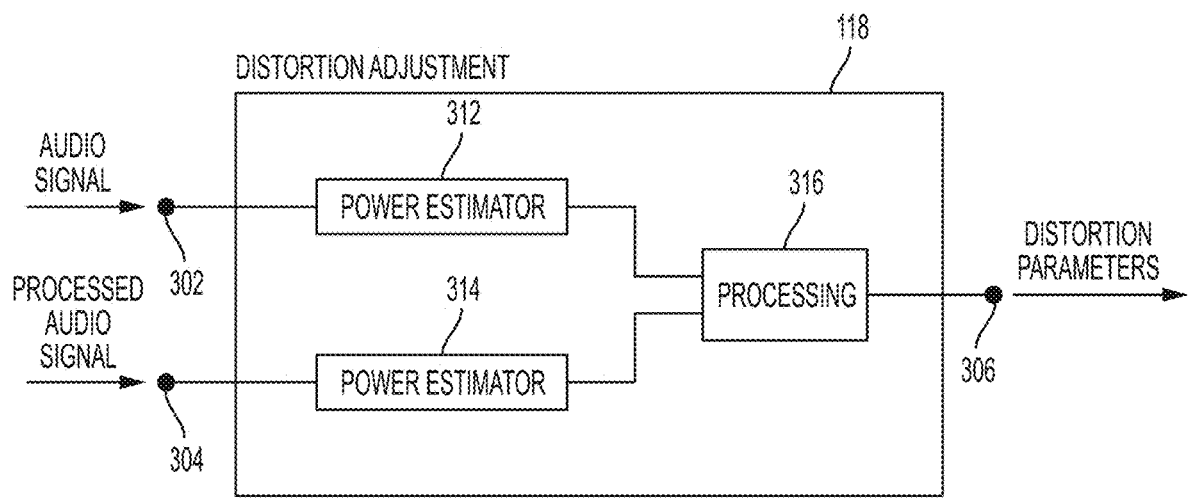
FIG. 3 is a block diagram illustrating a control circuit for adjusting the applied distortion according to some embodiments of the disclosure.

The distortion applied to low-frequency sounds may be dynamically adjusted, such as in real-time. One example block diagram for adjusting the distortion is shown in FIG. 3. FIG. 3 is a block diagram illustrating a control circuit for adjusting the applied distortion according to some embodiments of the disclosure. The distortion adjustment block 118 may include an input node 302 for receiving an audio signal and/or an input node 304 for receiving a processed audio signal, such as a distorted audio signal. A power estimator 312 may determine, such as by estimating, a power level for the audio signal received at input node 302; and a power estimator 314 may determine, such as by estimating, a power level for the processed audio signal received at input node 304. The determined power levels from the power estimators 312 and 314 may be delivered to processing block 316. The processing block 316 may generate one or more distortion parameters for controlling the adaptive distortion of an audio signal. The distortion parameters may be output to node 306, which may be coupled to a component that generates the distortion, such as the non-linear distortion block 114. The processing block 316 may perform mathematical calculations involving the power levels from power estimators 312 and 314. For example, a control block may determine the one or more parameters for controlling the Sigmoid function by dividing the power level from power estimator 314 of over-200 Hertz distortion components by the power level from power estimator 312 of the below-120 Hertz components of the original audio content. The one or more parameters output to output node 306 may be adjusted to maintain an approximate power ratio at a predetermined ratio, such as −6 dB.

Figure 4A:
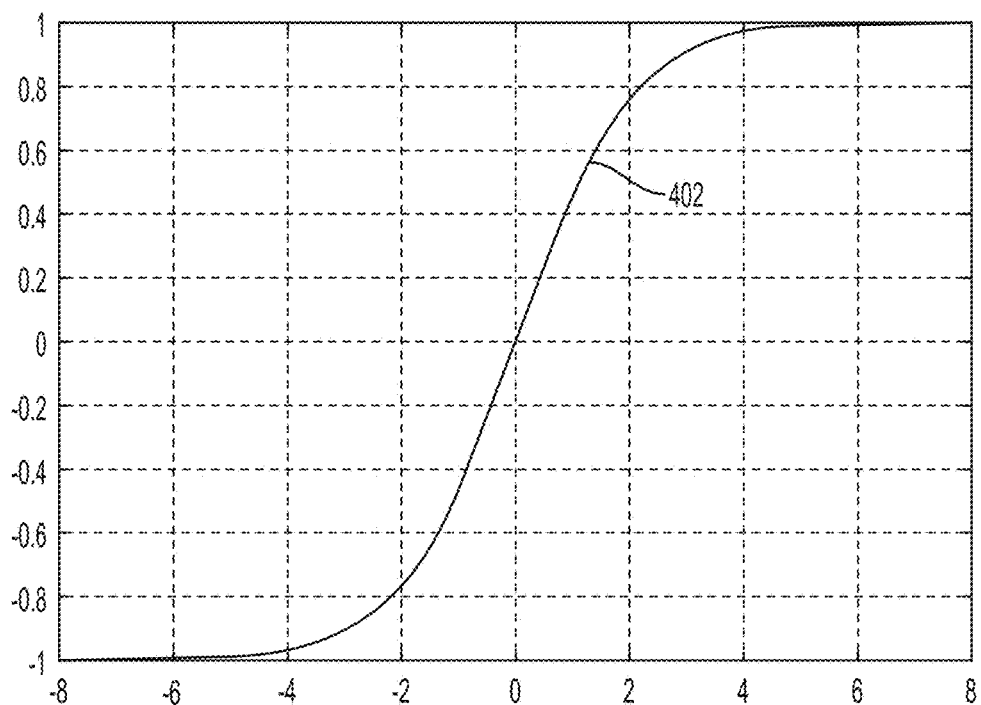
FIG. 4A is a graph illustrating an example mathematical function for generation of non-linear distortion according to some embodiments of the disclosure.

Referring back to FIG. 1, the non-linear distortion block 114 generates distortion using a non-linear mathematical function. One example function for the generation of distortion is a Sigmoid function. FIG. 4A is a graph illustrating an example mathematical function for generation of non-linear distortion according to some embodiments of the disclosure. A line 402 shows a Sigmoid function with an output scaled to between +1 and −1. The equation for the line 402 is:

$$y = \frac{2}{1 + \exp(-x)} - 1$$

Figure 4B:
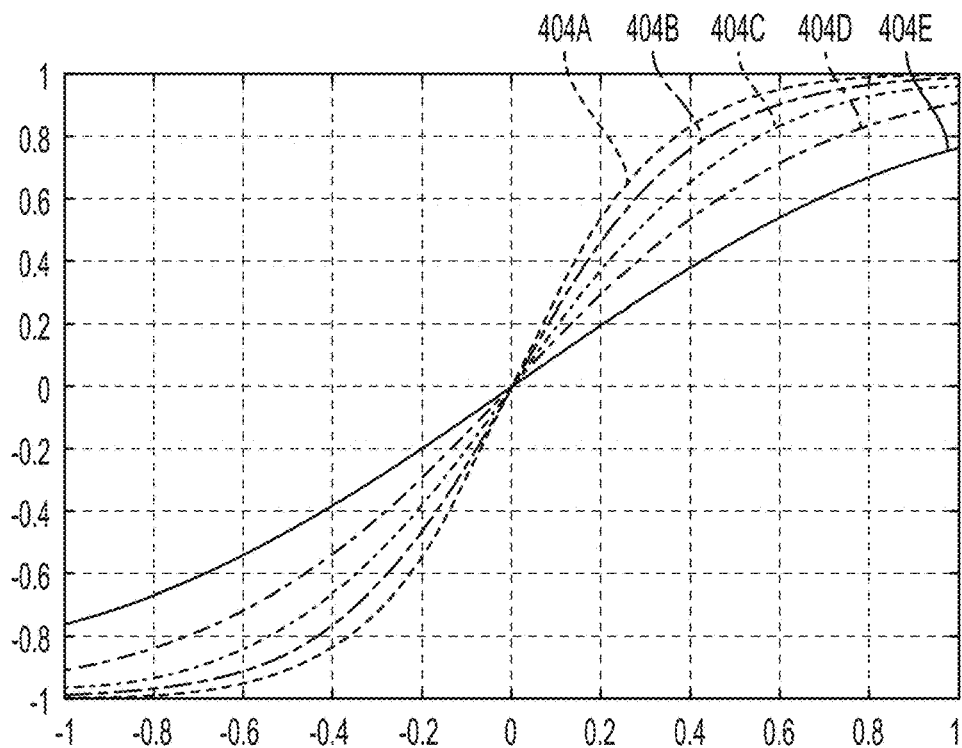
FIG. 4B are graphs illustrating an example adjustable mathematical function for generation of non-linear distortion according to some embodiments of the disclosure.

One aspect of the shape of the Sigmoid function of line 402 can be controlled by adjusting the Sigmoid function to include a scaling parameter for the term inside the exponential function. FIG. 4B are graphs illustrating an example adjustable mathematical function for generation of non-linear distortion according to some embodiments of the disclosure. Lines 404A-E show Sigmoid functions with scaling values of 2, 3, 4, 5, and 6. The equation for the distortion function shown in lines 404A-E is:

$$y = \frac{2}{1 + \exp(-x * distctrl)} - 1,$$

where distctrl is a control parameter for adjusting the Sigmoid function by setting the scaling value of the Sigmoid function, and thus the distortion the Sigmoid function applies to an audio signal. The distctrl parameter may adjust a sharpness of the Sigmoid function.

Figure 4C:
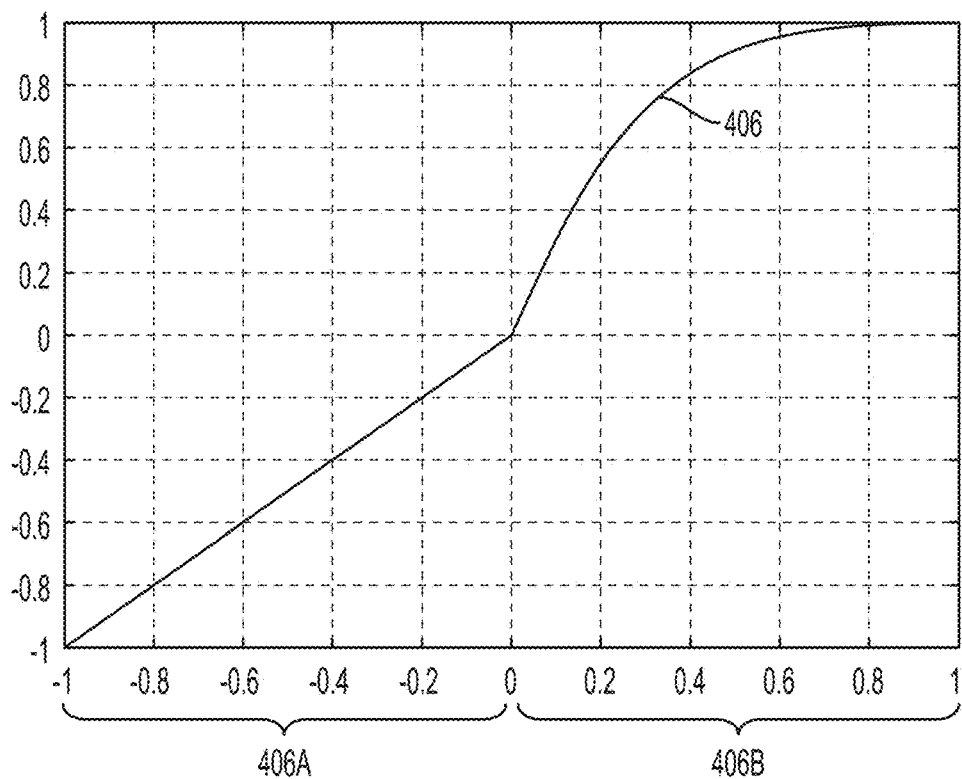
FIG. 4C is a graph illustrating another example mathematical function for generation of non-linear distortion according to some embodiments of the disclosure.

Another aspect of the shape of the Sigmoid function of line 402 by replacing a portion of the Sigmoid function with another function, such as a linear function. In one example, the Sigmoid function may be divided into a positive portion and a negative portion, and the negative or positive portion replaced with a linear function. FIG. 4C is a graph illustrating another example mathematical function for generation of non-linear distortion according to some embodiments of the disclosure. A line 406 shows a Sigmoid function with negative outputs replaced with a linear function in portion 406A, while portion 406B shows the Sigmoid shape. The value at which a distortion function switches from one function to another function is a control parameter that may be dynamically adjusted by a distortion adjustment block. The equation used on either side of the switching value is another control parameter that may be dynamically adjusted by the distortion adjustment block. The modification of the function in different portions may provide an asymmetric all-harmonic function. The equation for the distortion function shown in line 406 is:

$$y = \begin{cases} x, & x < 0 \\ \dfrac{1}{1 + \exp(-x * distctrl)} - 0.5, & x \geq 0 \end{cases}$$

Although Sigmoid functions and modified Sigmoid functions are described as examples for non-linear distortion functions, other non-linear distortion functions may also be implemented in the non-linear distortion block 114. For example, a polynomial function may be used to generate distortion, wherein the coefficients of the polynomial are control parameters for adjusting the distortion function. As a further example, a Chebyshev polynomial may be used to generate distortion, wherein the order of the Chebyshev polynomial and scaling of the Chebyshev polynomial are control parameters for adjusting the distortion function.

Bass enhancement may also or alternatively include the application of infinite companding to a portion of the audio signal. Infinite companding may be applied in combination with or separate from the non-linear distortion described with reference to FIG. 1. Infinite companding may include modification of the audio signal prior to application of distortion to improve the operation of the distortion function. For example, the audio signal may be modified during infinite companding by a first compression stage to boost the audio signal to a full-scale signal. An inverse expanding stage of the infinite companding operation may be applied after the distortion is generated to return the distorted audio signal to the original level of the original audio signal. An example implementation of infinite companding with non-linear distortion is shown in FIG. 5.

Figure 5:
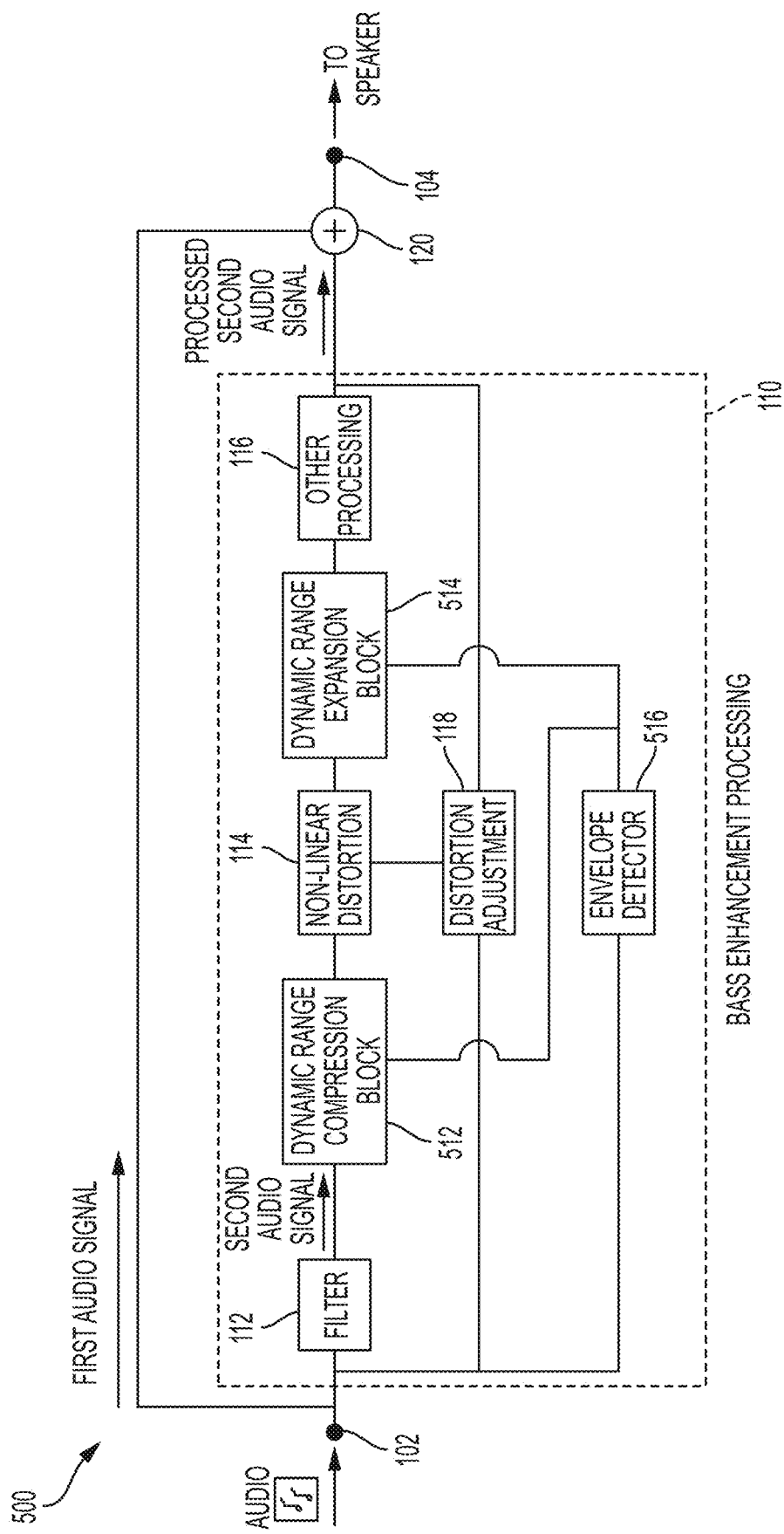
FIG. 5 is a block diagram illustrating bass enhancement processing with infinite companding according to some embodiments of the disclosure.

FIG. 5 is a block diagram illustrating bass enhancement processing with infinite companding according to some embodiments of the disclosure. An audio system 500 may include dynamic range compression block 512 coupled between the filter 112 and the non-linear distortion block 114. The audio system 500 may also include dynamic range expansion block 514 coupled between the non-linear distortion block 114 and the other processing block 116. Together the dynamic range compression block 512 and the dynamic range expansion block 514 comprise the infinite companding system. The dynamic range compression block 512 may scale the second audio signal to a scaled second audio signal. For example, the scaling applied by the dynamic range compression 512 may be sufficient to increase the second audio signal to full-scale. The dynamic range expansion block 514 may scale the distorted second audio signal generated by the non-linear distortion block 114 to reverse the scaling of the dynamic range compression 512. For example, dynamic range expansion block 514 may apply an inverse scaling to return the amplitude of the distorted second audio signal to an amplitude based on the second audio signal prior to dynamic range compression 512. The scaling applied by blocks 512 and/or 514 may be determined by an envelope detector 516 that measures an amplitude of the original audio signal and/or the second audio signal.

Figure 6:
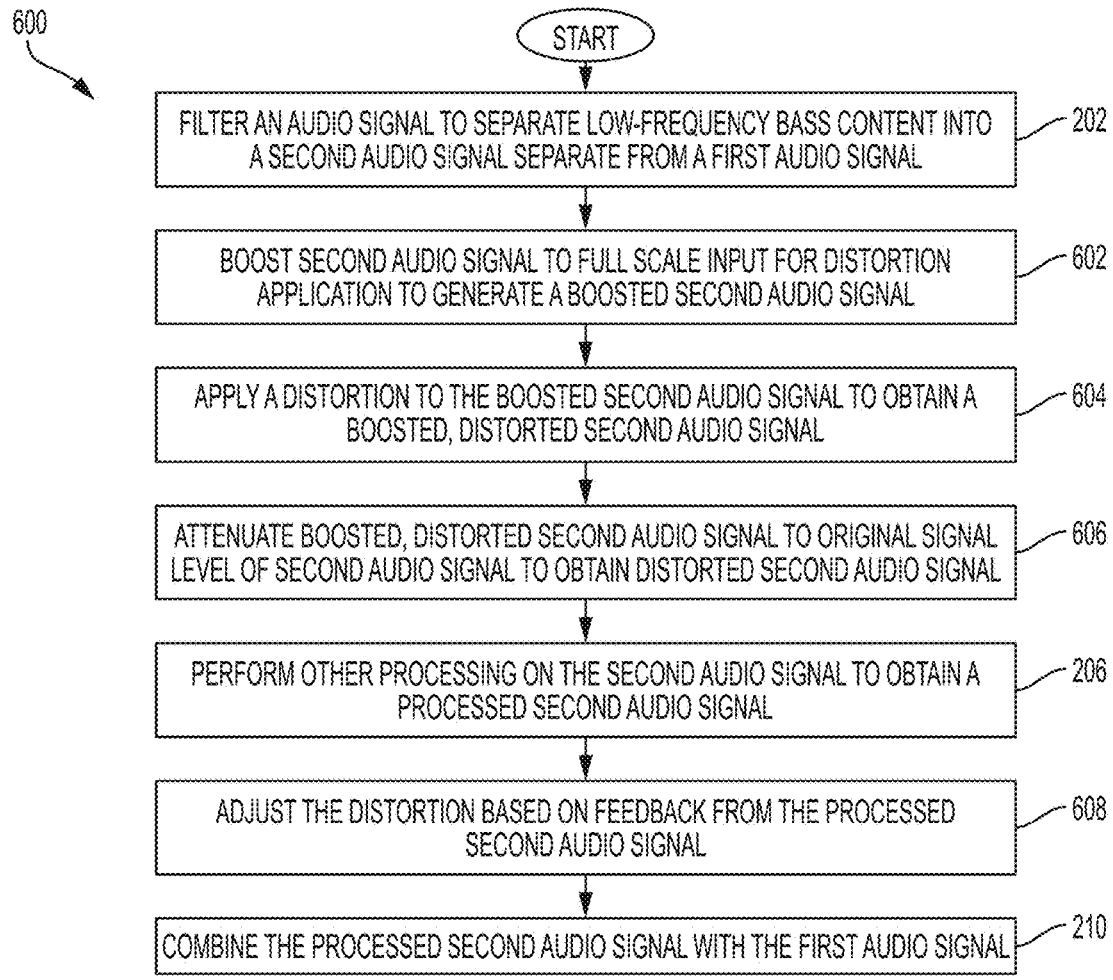
FIG. 6 is a flow chart illustrating an example method for bass enhancement using infinite companding according to some embodiments of the disclosure.

Operations performed by the dynamic range expansion/compression blocks 512 and 514 and the envelope detector 516 may include estimating a time-varying amplitude envelope of the second audio signal to produce a first amplitude envelope; applying a pre-distortion gain to the second audio signal before applying the non-linear distortion, wherein the applied pre-distortion gain is based, at least in part, on the first amplitude envelope, wherein the pre-distortion gain produces a compressed second audio signal that is substantially full-scale, and wherein the non-linear distortion is applied to the compressed second audio signal; applying an inverse gain to the distorted second audio signal after the non-linear distortion is applied, wherein the applied inverse gain is related to the pre-distortion gain; and adjusting the pre-distortion gain in response to the first amplitude envelope such that the distorted second audio signal has a time-varying amplitude approximately equal to the first amplitude envelope FIG. 6 is a flow chart illustrating an example method for bass enhancement using infinite companding according to some embodiments of the disclosure. A method 600 may include separating a first audio signal and a second audio signal from the original audio signal at block 202. The second audio signal may be boosted to full-scale input prior to distortion generation to generate a boosted second audio signal at block 602. Then, distortion may be applied to the boosted second audio signal to generate a boosted, distorted second audio signal at block 604. Next, the boosted, distorted second audio signal may be attenuated to an original signal level of the second audio signal to obtain the distorted second audio signal at block 606. Other processing may then be performed at block 206. At block 608, the distortion generated at block 604 may be adjusted based on feedback from the processed second audio signal. The processed second audio signal is combined with the first audio signal at block 210.

Figure 7:
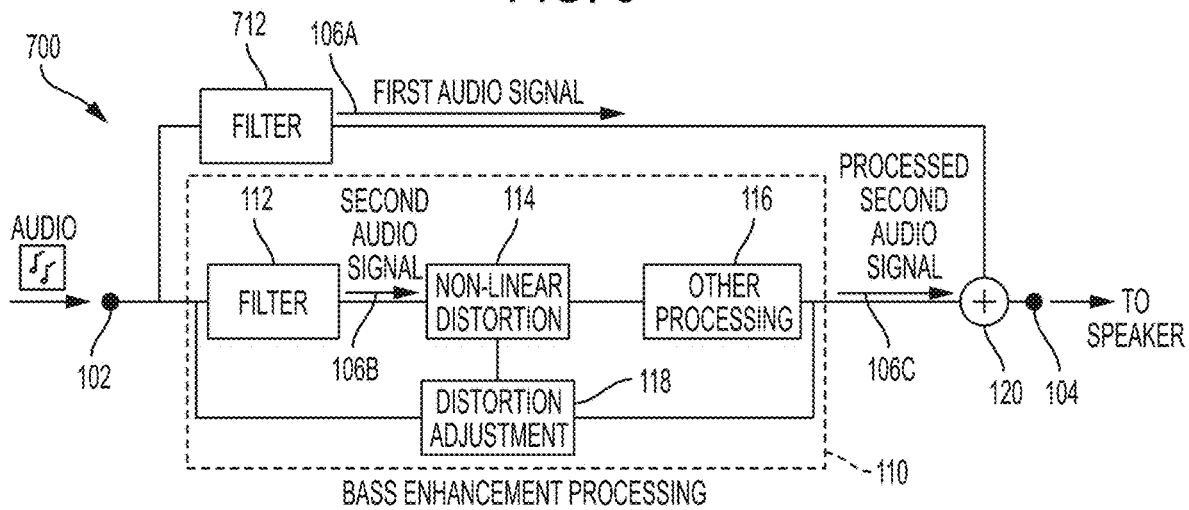
FIG. 7 is a block diagram illustrating bass enhancement processing with a band gap filter according to some embodiments of the disclosure.

Bass enhancement may also or alternatively include the application of a band gap filter to the audio signal. The first audio signal 106A and the second audio signal 106B generated from the original audio signal may include different content from the original audio signal. For example, the second audio signal 106B may include low-frequency sounds, whereas the first audio signal 106A may include all other content from the original audio signal. In some embodiments, some frequency content of the original audio signal may appear in neither the first audio signal 106A nor the second audio signal 106B. A "gap" may be created by using filters with different cut-off frequencies for generating the first audio signal 106A and the second audio signal 106B. One example of a gap band filter with non-linear distortion is shown in FIG. 7. However, the gap band filter may be used with or without the non-linear distortion or other bass enhancements.

FIG. 7 is a block diagram illustrating bass enhancement processing with a band gap filter according to some embodiments of the disclosure. An audio system 700 may include a filter 112 for generating the second audio signal 106B. The audio system 700 may also include a filter 712 for generating the first audio signal 106A. The filter 112 may be a low-pass filter to allow the low-frequency sounds to be processed by bass enhancement processing 110 that generates a high-pass signal that does not include the low-frequency sounds. The filter 712 may be a high-pass filter having a first cut-off frequency below which no frequency content is allowed in the first audio signal 106A. The filter 112 may be a low-pass filter having a second cut-off frequency above which no frequency content is allowed in the second audio signal 106B. The first and second cut-off frequencies may be different frequencies, such that the "gap" between the first and second cut-off frequencies contains frequency content that is eliminated. The band gap filter may prevent or reduce multiple sounds existing in the 120 Hertz-200 Hertz range, such as voice, keyboard, guitars, and bass, from being presented to the distortion system and may result in less intermodulation distortion. The result is a cleaner distorted bass signal.

Figure 8:
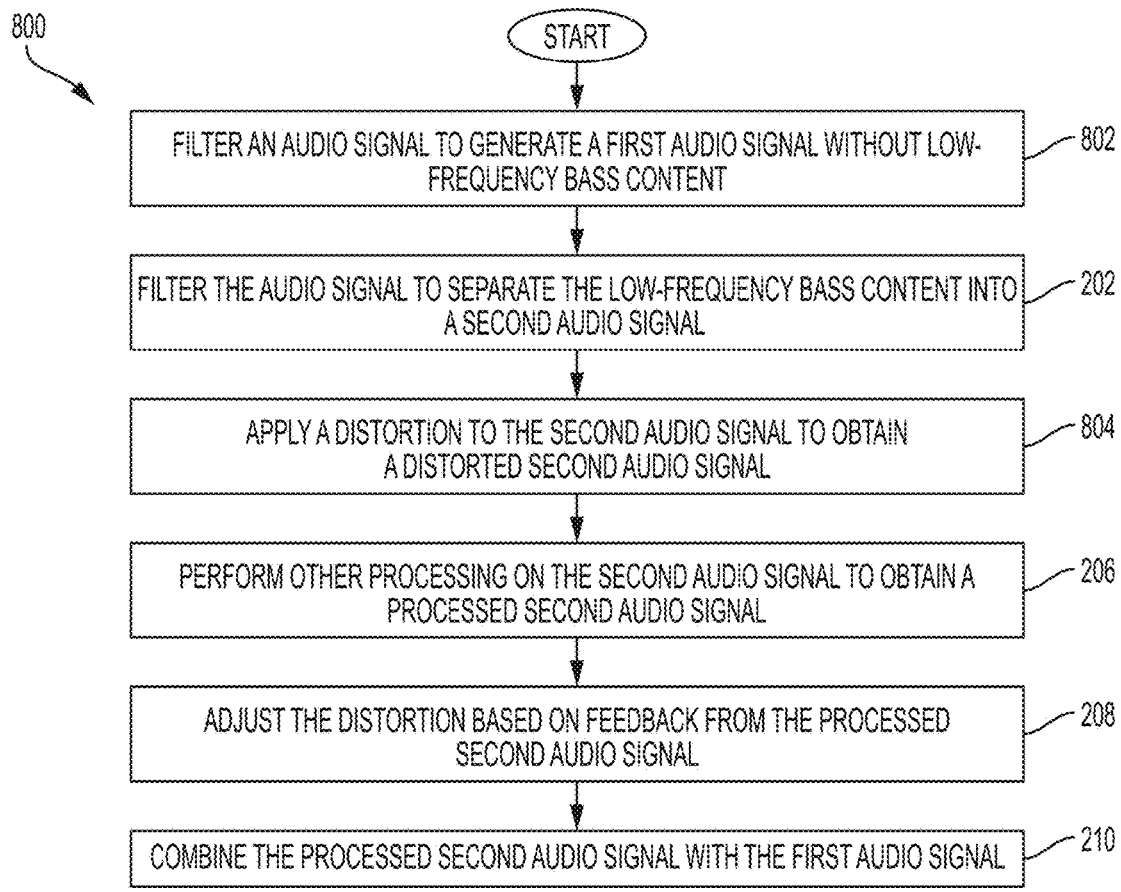
FIG. 8 is a flow chart illustrating an example method for bass enhancement using band gap filtering according to some embodiments of the disclosure.

FIG. 8 is a flow chart illustrating an example method for bass enhancement using band gap filtering according to some embodiments of the disclosure. A method 800 may begin with block 802 with filtering an original audio signal to generate a first audio signal without low-frequency bass content and with block 202 with filtering the original audio signal to generate a second audio signal with only the low-frequency bass content. The combination of blocks 802 and 202 may perform gap-band filtering on the original audio signal when the cut-off frequency for the filtering of blocks 802 and 202 are not equal. After gap-band filtering, at block 804, a distortion, such as a non-linear or Sigmoid distortion function, is applied to the second audio signal to generate a distorted second audio signal. Then, at block 206, further processing may be performed to obtain a processed second audio signal. Next, at block 208, the distortion is adjusted for continued bass enhancement processing. Then, at block 210, the processed second audio signal is combined with the first audio signal.

Figure 9:
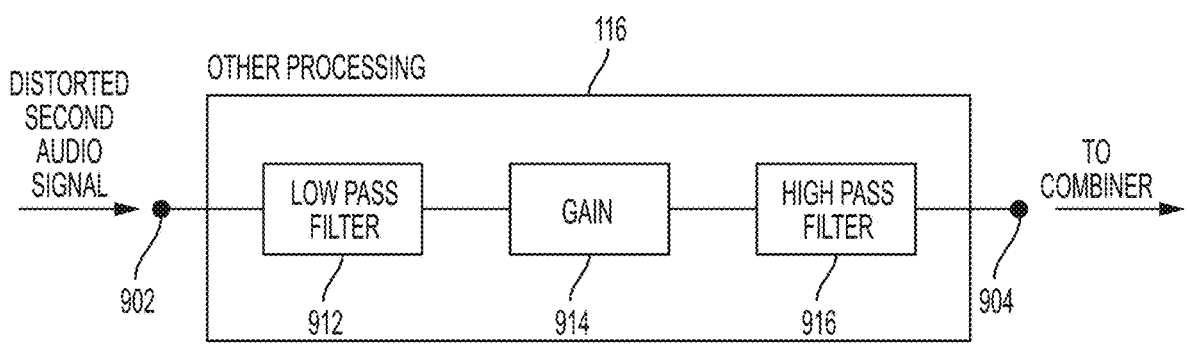
FIG. 9 is a block diagram illustrating additional audio processing for a distorted audio signal according to some embodiments of the disclosure.

Other processing may be applied to the first or second audio signals of the audio systems. One example of other processing incorporated into the second audio signal path is shown in FIG. 9. FIG. 9 is a block diagram illustrating additional audio processing for a distorted audio signal according to some embodiments of the disclosure. Other processing block 116 may include a low-pass filter 912, a gain block 914, and a high-pass filter 916. The low-pass filter 912 may receive the distorted second audio signal from the non-linear distortion block 114 at input node 902. The other processing may generate a processed second audio signal at output node 904. The low-pass filter 912 may be used to provide soft roll-off spectral shaping for the new frequency components generated by the non-linear distortion block 114. In one embodiment, the low-pass filter 912 may be a three-pole filter with a cut-off frequency slightly higher than the cut-off frequency generating the first audio signal, such as 300 Hertz. A gain block 914 may boost the amplitude of the new frequency components of the distortion. In one embodiment, a predetermined gain of, for example 21 dB, is applied by the gain block 914 to boost these new components up to a level near or approximately 6 dB below the low-frequency content of the original audio signal. The high-pass filter 916 may produce a filtered, distorted second audio signal that is the processed second audio signal. The distorted components below 200 Hz components may be removed by the high-pass filter 916 because they may be below the microspeaker's audibility threshold. Another example of other processing that may also be applied in addition to the bass enhancement processing is speaker protection that limits speaker excursion to a predetermined value.

Figure 10:
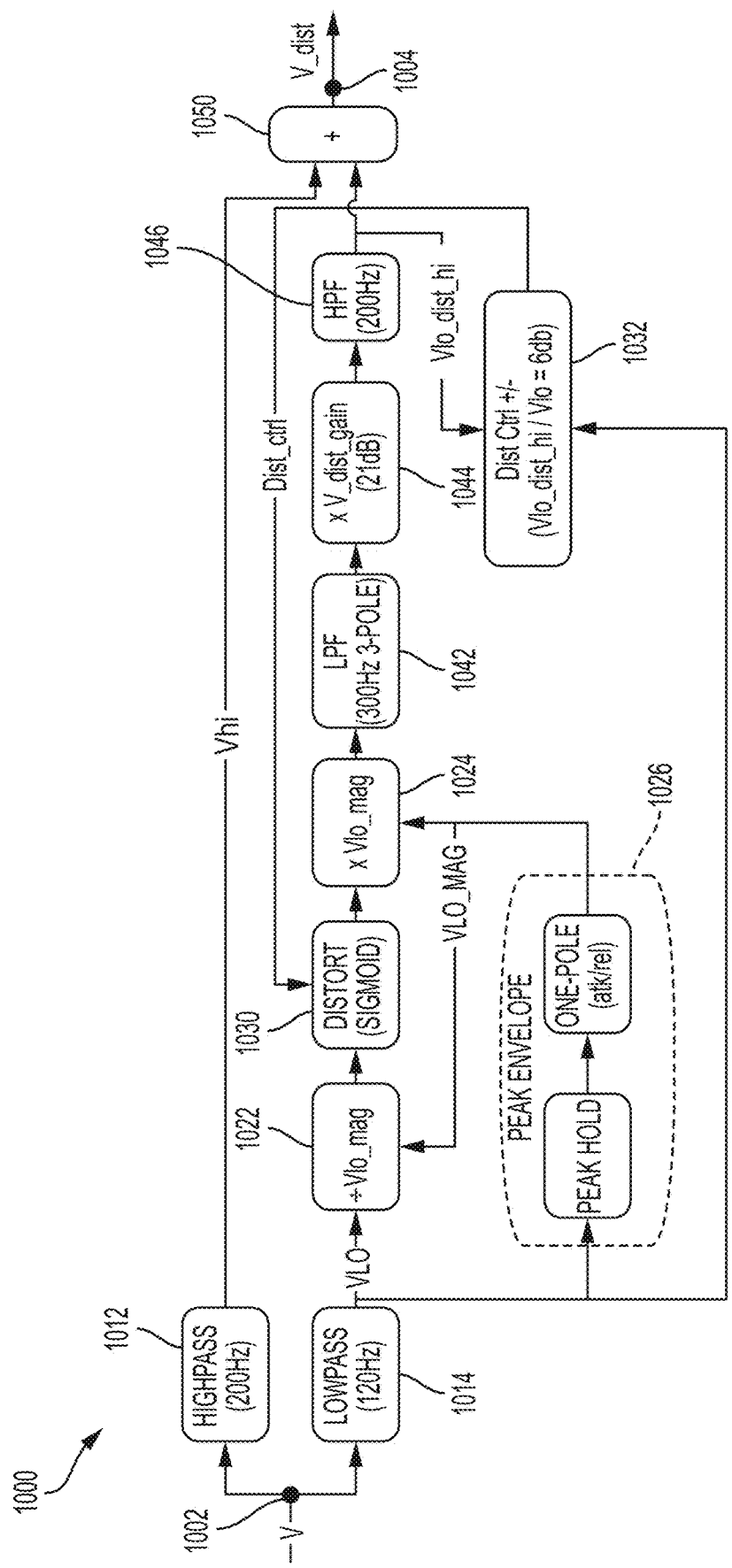
FIG. 10 is a block diagram illustrating one implementation of bass enhancement processing according to some embodiments of the disclosure.

One embodiment of an audio system with bass enhancement processing may include combinations of the features described above, such as non-linear distortion, infinite companding, adjustable distortion, and bad-gap filtering. FIG. 10 is a block diagram illustrating one implementation of bass enhancement processing according to some embodiments of the disclosure. An audio system 1000 may include a band-gap filter formed from high-pass filter 1012 and low-pass filter 1014. The first audio signal generated by the high-pass filter 1012 may be passed to combiner 1050. The combiner 1050 may combine a processed second audio signal with the first audio signal. The processed audio signal may be generated by several processing steps, including processing in the infinite companding blocks 1022 and 1024 and application of non-linear distortion block 1030. The infinite companding blocks 1022 and/or 1024 may be controlled by peak envelope detector 1026. The non-linear distortion block 1030 may be controlled by adaptive control bock 1032. Other processing of the audio signal may include low-pass filtering at block 1044. Other processing of the audio signal may include applying a gain at block 1044 and a high-pass filter at block 1046. The audio system may thus receive an original audio signal at input node 1002 and produce an output audio signal with enhanced bass at output node 1004.

Figure 11A:
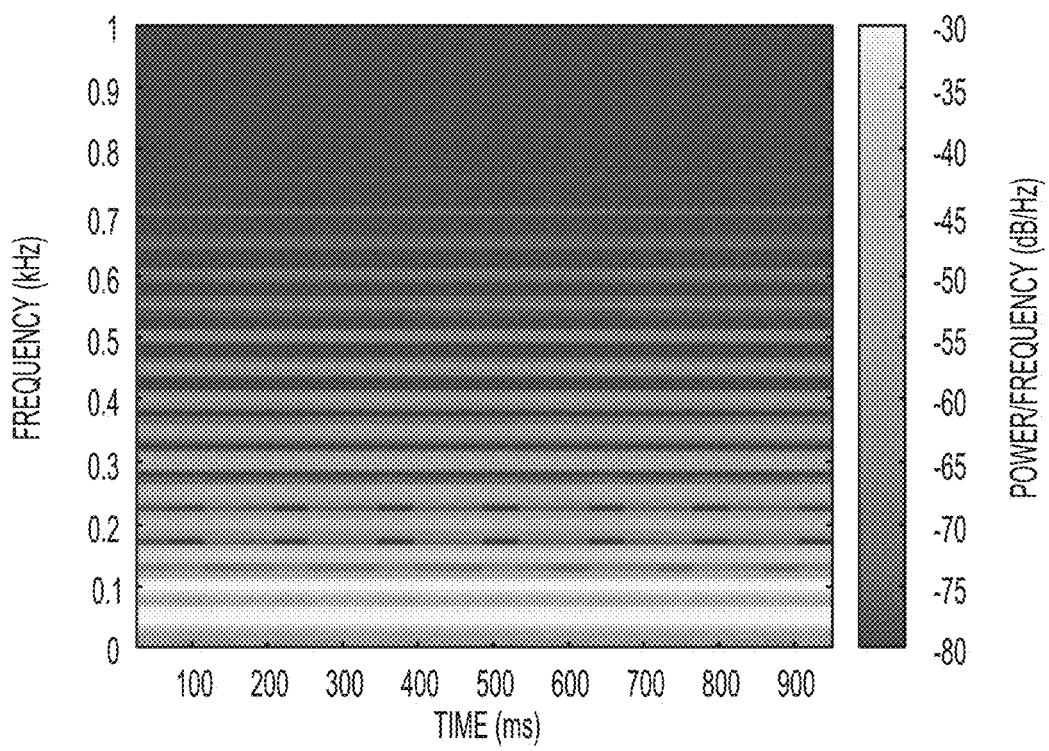
FIGS. 11A-F are graphs illustrating an operation of bass enhancement processing on a sample audio signal according to some embodiments of the disclosure.
Figure 11B:
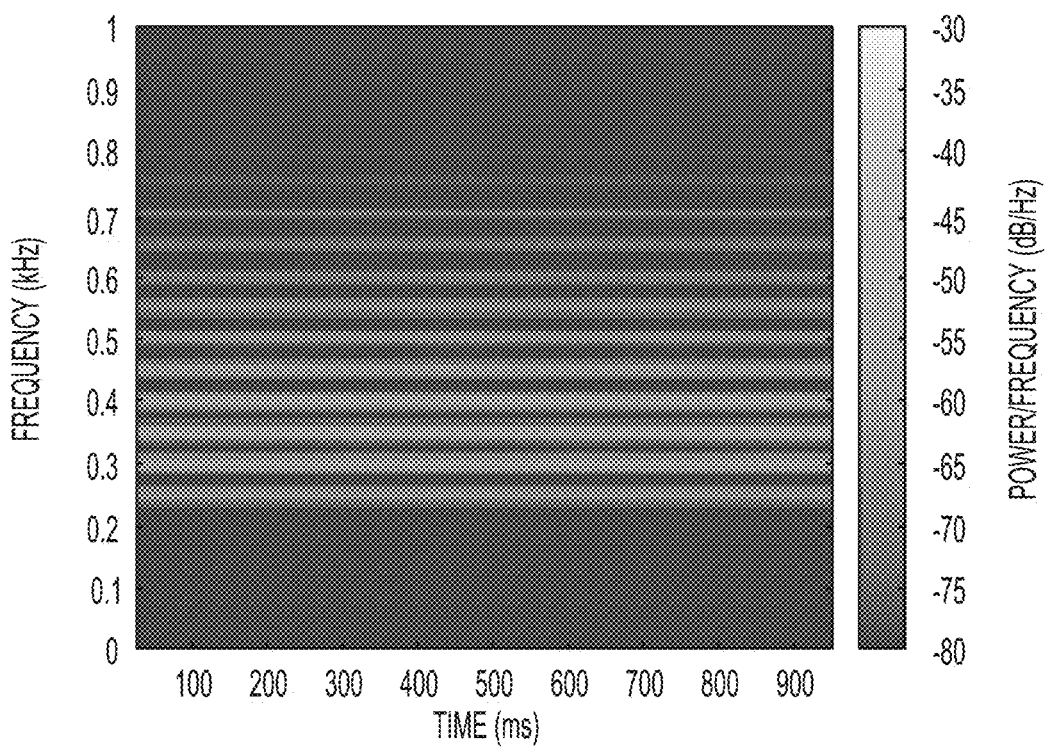
Figure 11C:
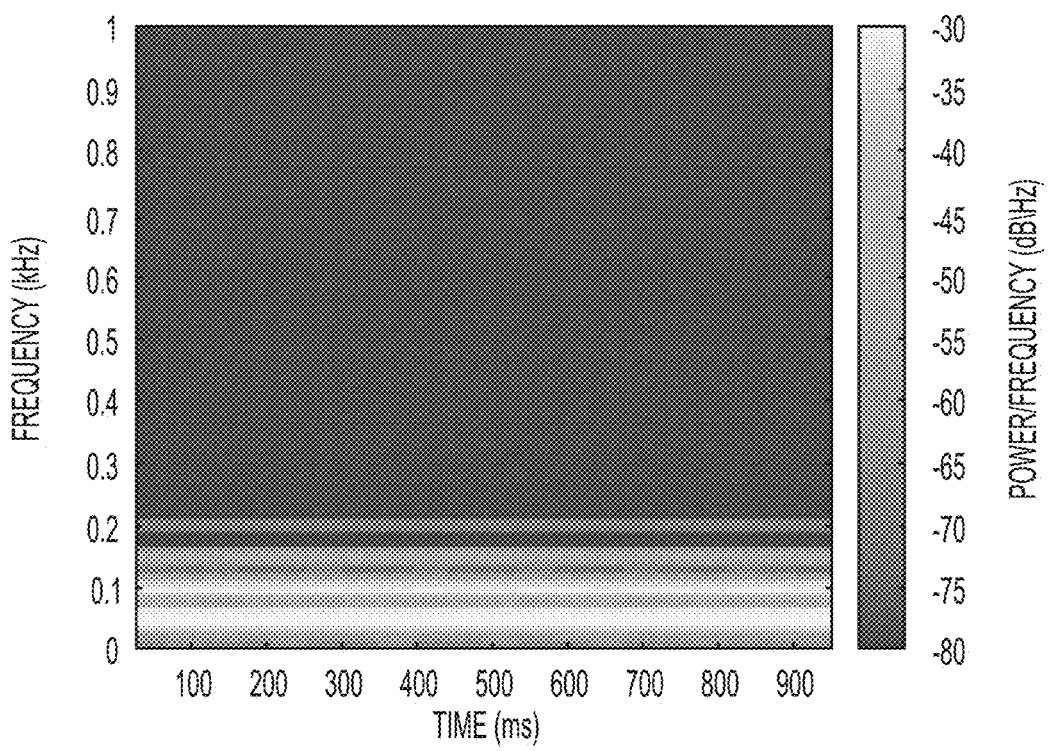
Figure 11D:
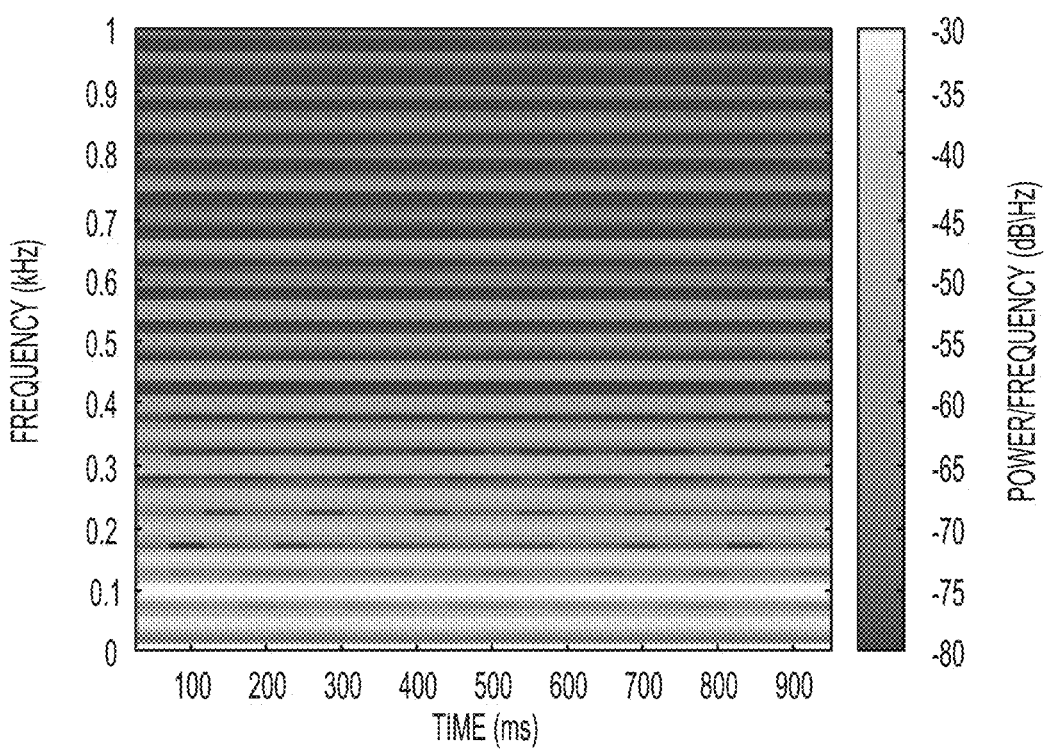
Figure 11E:
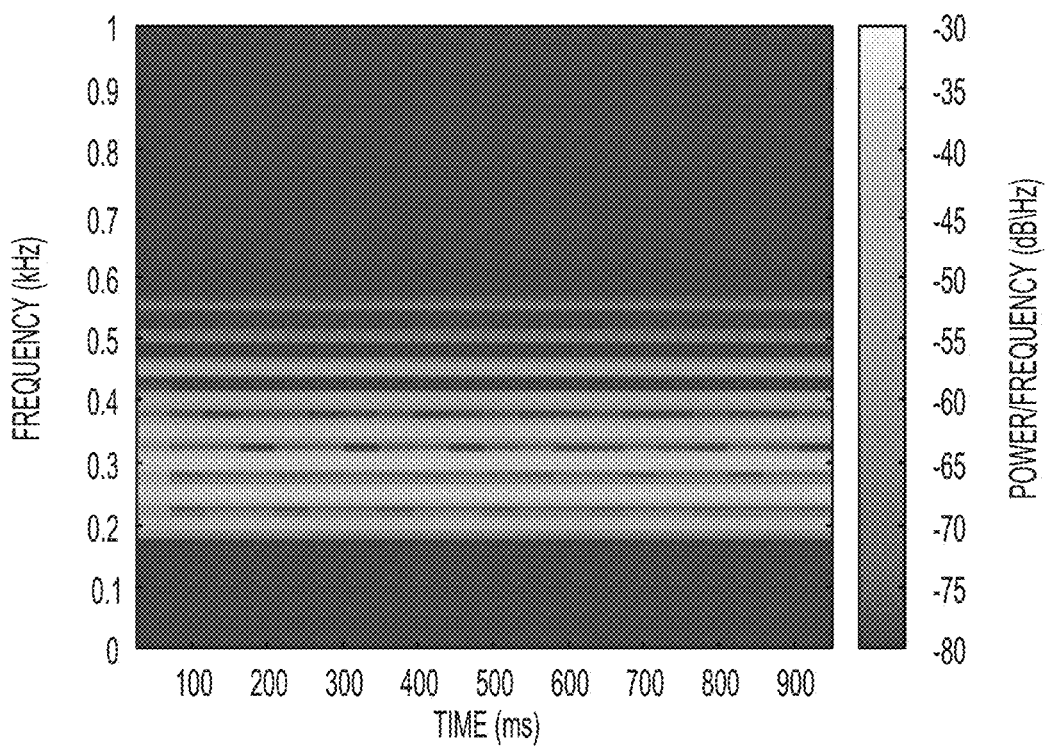
Figure 11F:
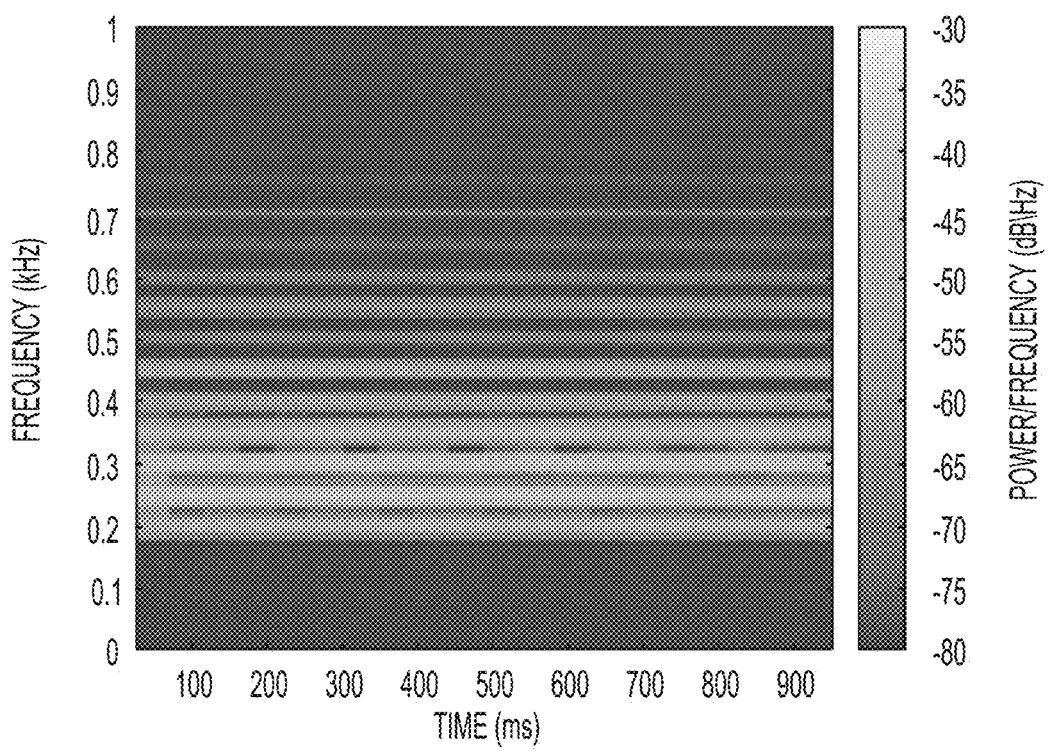

Example operation of an audio system on an audio signal is now described with reference to FIGS. 11A-F. FIGS. 11A-F are graphs illustrating an operation of bass enhancement processing on a sample audio signal according to some embodiments of the disclosure. FIG. 11A shows an original audio signal with a 50 Hertz bass tone and its harmonics, such as may be received at input node 102. FIG. 11B shows an example of the first audio signal 106A after applying a high-pass filter to the original audio signal. FIG. 11C shows an example of the second audio signal 106B after applying the low-pass filter to the original audio content. The audio signal illustrated in FIG. 11C is distorted to form the distorted second audio signal shown in FIG. 11D. The distorted second audio signal is then further processed, such as by band-pass filtering in the other processing block 116, to obtain the example processed second audio signal 106C shown in FIG. 11E. The processed second audio signal of FIG. 11E is then recombined with the first audio signal of FIG. 11B to obtain the combined audio signal of FIG. 11F, which may be produced at output node 104.

Figure 12:
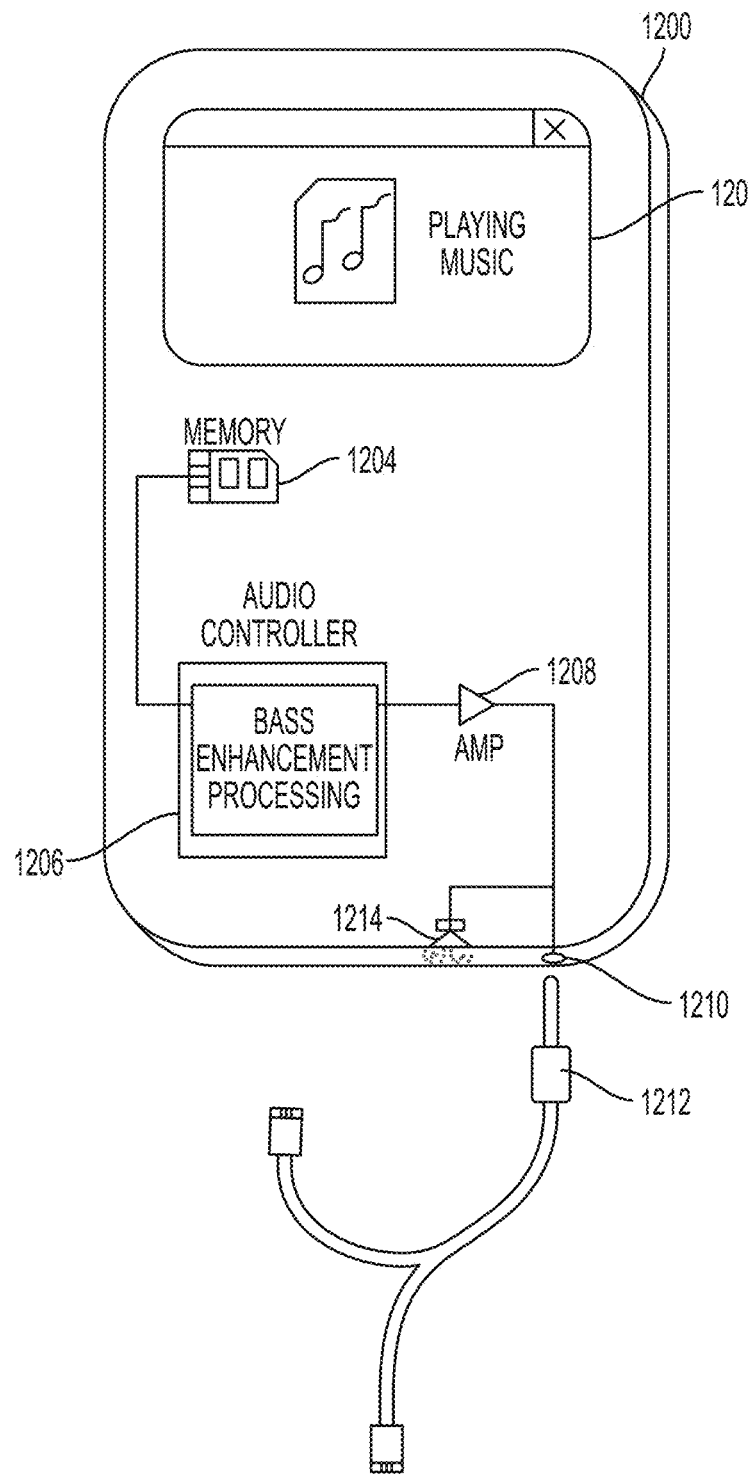
FIG. 12 is an illustration of a mobile device performing bass enhancement processing on a music file for playback to a user through a speaker according to some embodiments of the disclosure.

One example of an electronic device incorporating the one or more bass enhancement techniques and systems described herein is shown in FIG. 12. FIG. 12 is an illustration of a mobile device performing bass enhancement processing on a music file for playback to a user through a speaker according to some embodiments of the disclosure. A personal media device 1200 may include a display 1202 for allowing a user to select from music files for playback. When music files are selected by a user, audio files may be retrieved from memory 1204 by an application processor (not shown) and provided to an audio controller 1206. The audio data stream may be provided to the audio controller 1206 according to, for example, a standard-fidelity PCM encoding or a high-definition DoP encoding (DSD over PCM). The audio controller 1206 may include bass enhancement processing described herein. The digital data retrieved from memory 1204 may be converted to analog signals by the audio controller 1206, and those analog signals amplified by an amplifier 1208. The amplifier 1208 may be coupled to a microspeaker 1214 integrated with the personal media device 1200, and/or to headphones 1212 coupled through an audio connector 1210 such as a 2.5 mm, 3.5 mm, or USB-C connector. Although the data received at the audio controller 1206 is described as being received from memory 1204, the audio data may also be received from other sources, such as a USB connection, a device connected through Wi-Fi to the personal media device 1200, a cellular radio, an Internet-based server, another wireless radio, and/or another wired connection.

The schematic flow chart diagrams of FIG. 2, FIG. 6, and FIG. 8 are generally set forth as a logical flow chart diagram. Likewise, other operations for the circuitry are described without flow charts herein as sequences of ordered steps. The depicted order, labeled steps, and described operations are indicative of aspects of methods of the invention. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor capable of executing instructions contained in software. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The term "approximately equal" as used to describe two values may refer to approximately 5% or less than 5% difference between the two values.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As another example, although digital signal processors (DSPs) are described for performing certain mathematical functions, aspects of the invention may be executed by other processors, such as graphics processing units (GPUs) and central processing units (CPUs). As another example, although processing of audio data is described, other data may be processed through the filters and other circuitry described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
    receiving an input audio signal;
    generating a first audio signal from the input audio signal;
    applying a low-pass filter to the input audio signal to generate a second audio signal;
    processing the second audio signal to form a processed second audio signal of the input audio signal, wherein the processing comprises the steps of:
        applying a non-linear distortion to at least a portion of a frequency spectrum of the second audio signal to obtain a distorted second audio signal, wherein the processed second audio signal is based, at least in part, on the distorted second audio signal, wherein applying the non-linear distortion produces a series of harmonics as a high-frequency distortion band comprising integer multiples of a fundamental frequency, the fundamental frequency being in a low-frequency band of the input audio signal below a high-frequency cut-off of the low-pass filter; and
        adjusting parameters for the non-linear distortion applied to the second audio signal based, at least in part, on the processed second audio signal to maintain a relationship of a measure of intensity in a high-frequency distortion band of the non-linear distortion to a measure of intensity in the low-frequency band; and
    combining the processed second audio signal with the first audio signal to produce an output audio signal.

2. The method of claim 1, wherein the step of generating the first audio signal comprises applying a high-pass filter to the input audio signal to generate the first audio signal, wherein the step of applying the high-pass filter to the input audio signal generates a first audio signal with approximately zero content below a first frequency, wherein the step of applying the low-pass filter to the input audio signal generates the second audio signal with approximately zero frequency content above a second frequency, and wherein the first frequency is higher than the second frequency.

3. The method of claim 1, wherein the step of processing the second audio signal comprises:
estimating a time-varying amplitude envelope of the second audio signal to produce a first amplitude envelope;
applying a pre-distortion gain to the second audio signal before applying the non-linear distortion, wherein the applied pre-distortion gain is based, at least in part, on the first amplitude envelope, wherein the pre-distortion gain produces a compressed second audio signal that is substantially full-scale, and wherein the non-linear distortion is applied to the compressed second audio signal;
applying an inverse gain to the distorted second audio signal after the non-linear distortion is applied, wherein the applied inverse gain is related to the pre-distortion gain; and
adjusting the pre-distortion gain in response to the first amplitude envelope such that the distorted second audio signal has a time-varying amplitude approximately equal to the first amplitude envelope.

4. The method of claim 1, wherein the step of applying the non-linear distortion comprises applying a sigmoid-based function.

5. The method of claim 1, wherein the step of processing the second audio signal to form a processed second audio signal comprises applying a high-pass filter to the distorted second audio to produce a filtered, distorted second audio signal, and
wherein the step of adjusting the non-linear distortion comprises:
estimating a first time-varying power of the second audio signal; and
estimating a second time-varying power of the processed second audio signal,
wherein the non-linear distortion is adjusted based, at least in part, on the first time-varying power and the second time-varying power, and the adjusted non-linear distortion is applied to maintain an approximately constant ratio of the first time-varying power to the second time-varying power.

6. The method of claim 1, wherein the step of processing the second audio signal comprises the steps of:
applying a post-distortion gain to the distorted second audio signal to produce a gained, distorted second audio signal.

7. The method of claim 1, further comprising outputting the output audio signal to a transducer, wherein the transducer is a microspeaker.

8. The method of claim 7, wherein the input audio signal is received by an audio controller from an application processor of a mobile computing device.

9. An apparatus, comprising:
an audio controller configured to perform steps comprising:
processing a second audio signal to form a processed second audio signal, wherein the second audio signal comprises low-frequency content of an original audio signal, and wherein the processing comprises the steps comprising:
applying a non-linear distortion to at least a portion of a frequency spectrum of a second audio signal to obtain a distorted second audio signal wherein the second audio signal comprises low-frequency content of an original audio signal, wherein the non-linear distortion produces a series of harmonics as a high-frequency distortion band comprising integer multiples of a fundamental frequency, the fundamental frequency being in a low-frequency band of the input audio signal below a high-frequency cut-off of the low-pass filter; and
adjusting parameters for the non-linear distortion applied to the second audio signal based, at least in part, on the processed second audio signal to maintain a relationship of a measure of intensity in a high-frequency distortion band of the non-linear distortion to a measure of intensity in the low-frequency band;
combining the processed second audio signal with a first audio signal to produce an output audio signal, wherein the first audio signal comprises the original audio content without the low-frequency content.

10. The apparatus of claim 9, wherein the step of processing the second audio signal comprises:
estimating a time-varying amplitude envelope of the second audio signal to produce a first amplitude envelope;
applying a pre-distortion gain to the second audio signal before applying the non-linear distortion, wherein the applied pre-distortion gain is based, at least in part, on the first amplitude envelope, wherein the pre-distortion gain produces a compressed second audio signal that is substantially full-scale, and wherein the non-linear distortion is applied to the compressed second audio signal;
applying an inverse gain to the distorted second audio signal after the non-linear distortion is applied, wherein the applied inverse gain is related to the pre-distortion gain; and
adjusting the pre-distortion gain in response to the first amplitude envelope such that the distorted second audio signal has a time-varying amplitude substantially similar to the first amplitude envelope.

11. The apparatus of claim 9, wherein the step of applying the non-linear distortion comprises applying a sigmoid-based function.

12. The apparatus of claim 9, wherein the step of processing the second audio signal to form a processed second audio signal comprises applying a high-pass filter to the distorted second audio to produce a filtered, distorted second audio signal, and
wherein the step of adjusting the non-linear distortion comprises:
estimating a first time-varying power of the second audio signal; and
estimating a second time-varying power of the processed second audio signal,
wherein the non-linear distortion is adjusted based, at least in part, on the first time-varying power and the second time-varying power and the adjusted non-linear distortion is applied to maintain an approximately constant ratio of the first time-varying power to the second time-varying power.

13. The apparatus of claim 9, wherein the step of processing the second audio signal comprises the steps of:
applying a post-distortion gain to the distorted second audio signal to produce a gained, distorted second audio signal.

14. The apparatus of claim 9, wherein the audio controller is configured to couple to an amplifier configured to output an output signal to a transducer, wherein the transducer is a microspeaker.

15. The apparatus of claim 9, wherein the audio controller is configured to couple to a memory for retrieving a music file comprising the input audio signal.

16. An apparatus, comprising:
an input node configured to receive an input audio signal;
a gap band filter coupled to the input node and configured to generate a first audio signal without low-frequency content and to generate a second audio signal with low-frequency content;
a bass processing block configured to receive the second audio signal and to generate a processed second audio signal from the second audio signal, the bass processing block comprising:
a dynamic range compression block configured to scale the second audio signal to obtain a scaled second audio signal;
a non-linear distortion block configured to apply a non-linear distortion to the scaled second audio signal to obtain a distorted second audio signal, wherein the non-linear distortion produces a series of harmonics as a high-frequency distortion band comprising integer multiples of a fundamental frequency, the fundamental frequency being in a low-frequency band of the input audio signal below a high-frequency cut-off of the second audio signal;
a dynamic range expansion block configured to scale the distorted second audio signal to obtain a scaled distorted second audio signal, wherein the processed second audio signal is based, at least in part, on the scaled distorted second audio signal; and
a distortion adjustment block configured to adjust parameters for the non-linear distortion applied to the second audio signal based, at least in part, on the processed second audio signal to maintain a relationship of a measure of intensity in a high-frequency distortion band of the non-linear distortion to a measure of intensity in the low-frequency band; and
a combiner coupled to the bass processing block to receive the processed second audio signal and coupled to the gap band filter to receive the first audio signal.

17. The apparatus of claim 16, wherein the non-linear distortion block is configured to apply a sigmoid-based function to the scaled second audio signal.

18. The apparatus of claim 16, wherein the distortion adjustment block is configured to perform steps comprising:
estimating a first time-varying power of the second audio signal; and
estimating a second time-varying power of the processed second audio signal,
wherein the non-linear distortion is adjusted based, at least in part, on the first time-varying power and the second time-varying power, and the adjusted non-linear distortion is applied to maintain an approximately constant ratio of the first time-varying power to the second time-varying power.

19. The apparatus of claim 16, wherein the dynamic range compression block is configured to perform steps comprising:
estimating a time-varying amplitude envelope of the second audio signal to produce a first amplitude envelope;
applying a pre-distortion gain to the second audio to obtain the scaled second audio signal, wherein the applied pre-distortion gain is based, at least in part, on the first amplitude envelope; and
adjusting the pre-distortion gain in response to the first amplitude envelope such that the scaled distorted second audio signal has a time-varying amplitude approximately equal to the first amplitude envelope, and
wherein the dynamic range expansion block is configured to perform steps comprising:
applying an inverse gain to the distorted second audio signal to obtain the scaled distorted second audio signal, wherein the applied inverse gain is related to the pre-distortion gain.

20. The apparatus of claim 16, a transducer coupled to the combiner, wherein the transducer is a microspeaker.

* * * * *

UNITED STATES PATENT AND TRADEMARK OFFICE
CERTIFICATE OF CORRECTION

PATENT NO. : 11,109,155 B2
APPLICATION NO. : 15/435574
DATED : August 31, 2021
INVENTOR(S) : Eric Lindemann It is certified that error appears in the above-identified patent and that said Letters Patent is hereby corrected as shown below:

In the Specification

In Column 4, Line 3, delete "enhancement" and insert -- enhancement. --, therefor.

In Column 6, Line 52, delete "bass enhancement block 110" and insert -- bass enhancement processing block 110 --, therefor.

In Column 9, Line 13, delete "for" and insert -- of --, therefor.

In Column 9, Lines 63-64, delete "dynamic range expansion/compression blocks 512 and 514" and insert -- dynamic range expansion/compression blocks 514 and 512 --, therefor.

In Column 10, Line 13, delete "envelope" and insert -- envelope. --, therefor.

In Column 11, Line 48, delete "the" and insert -- then --, therefor.

In Column 12, Lines 7-8, delete "low-pass filtering at block 1044." and insert -- low-pass filtering at block 1042. --, therefor.

In Column 12, Lines 46-47, delete "DoP encoding (DSD over PCM)." and insert -- DoP (DSD over PCM) encoding. --, therefor.

In Column 13, Line 54, delete "includes" and insert -- include --, therefor.

In Column 13, Line 55, delete "(CD)," and insert -- (CDs), --, therefor.

In Column 13, Line 56, delete "(DVD)," and insert -- (DVDs), --, therefor.

Signed and Sealed this
Fourth Day of April, 2023

*Katherine Kelly Vidal*

Katherine Kelly Vidal
*Director of the United States Patent and Trademark Office*

In the Claims

In Column 16, Line 55, in Claim 12, delete "power" and insert -- power, --, therefor.